(12) United States Patent
Levesque et al.

(10) Patent No.: US 10,534,435 B2
(45) Date of Patent: Jan. 14, 2020

(54) HANDHELD INTERFACE DEVICE HAVING A PLURALITY OF ELECTROSTATIC FRICTION (ESF) ELECTRODES

(71) Applicant: Immersion Corporation, San Jose, CA (US)

(72) Inventors: Vincent Levesque, Montreal (CA); Mohammadreza Motamedi, Montreal (CA)

(73) Assignee: IMMERSION CORPORATION, San Jose, CA (US)

( * ) Notice: Subject to any disclaimer, the term of this patent is extended or adjusted under 35 U.S.C. 154(b) by 0 days.

(21) Appl. No.: 15/355,353

(22) Filed: Nov. 18, 2016

(65) Prior Publication Data
US 2018/0143685 A1 May 24, 2018

(51) Int. Cl.
*G06F 3/01* (2006.01)
*G06F 3/033* (2013.01)
(Continued)

(52) U.S. Cl.
CPC ............ *G06F 3/016* (2013.01); *G06F 1/1626* (2013.01); *G06F 1/1684* (2013.01); *G06F 1/3231* (2013.01); *G06F 3/033* (2013.01); *G06F 3/041* (2013.01); *G06F 2200/1637* (2013.01); *H03K 2217/96062* (2013.01); *Y02D 10/173* (2018.01)

(58) Field of Classification Search
None
See application file for complete search history.

(56) References Cited

U.S. PATENT DOCUMENTS 8,941,475 B2   1/2015   Makinen et al.
9,383,821 B2   7/2016   Wakuda et al.
(Continued)

FOREIGN PATENT DOCUMENTS

EP   2 784 630 A1   10/2014
EP   2 851 763 A1   3/2015
(Continued)

OTHER PUBLICATIONS

Search Report dated Mar. 23, 2018 in corresponding European Patent Application No. 17 20 2201.
(Continued)

*Primary Examiner* — Amare Mengistu
*Assistant Examiner* — Sarvesh J Nadkarni
(74) *Attorney, Agent, or Firm* — Medler Ferro Woodhouse & Mills PLLC

(57) ABSTRACT

A handheld interface device configured to provide an electrostatic friction (ESF) effect is provided. The device comprises a plurality of more than two electrodes, with each electrode being separately disposed at a respective portion of an outer surface of the interface device. Each electrode is covered by or forms a respective portion of the outer surface of the handheld interface device. The device includes a control unit that is configured to determine a contact condition at each electrode of the plurality of electrodes, to select a subset of the plurality of electrodes based on the determined contact condition at each electrode of the plurality of electrodes, and to apply a drive signal for generating electrostatic friction to only one or more electrodes in the selected subset of the plurality of electrodes.

14 Claims, 11 Drawing Sheets

(51) Int. Cl.
*G06F 3/041* (2006.01)
*G06F 1/3231* (2019.01)
*G06F 1/16* (2006.01)

(56) References Cited

U.S. PATENT DOCUMENTS

| | | | |
|---|---|---|---|
| 9,383,822 B2 | 7/2016 | Wakuda et al. | |
| 9,417,694 B2 | 8/2016 | Birnbaum et al. | |
| 2008/0150891 A1* | 6/2008 | Berkley | G06F 3/016 345/156 |
| 2011/0109588 A1* | 5/2011 | Makinen | G09B 21/003 345/174 |
| 2011/0187516 A1* | 8/2011 | Makinen | B60W 50/16 340/425.5 |
| 2011/0285667 A1* | 11/2011 | Poupyrev | G06F 3/016 345/174 |
| 2012/0287068 A1* | 11/2012 | Colgate | G06F 3/016 345/173 |
| 2013/0252736 A1* | 9/2013 | Akifusa | A63F 13/06 463/37 |
| 2015/0185849 A1 | 7/2015 | Levesque et al. | |
| 2016/0004309 A1 | 1/2016 | Modarres et al. | |
| 2016/0062537 A1* | 3/2016 | Kim | G06F 3/0416 345/174 |
| 2016/0334914 A1* | 11/2016 | Kim | G06F 3/0414 |
| 2017/0269693 A1* | 9/2017 | Modarres | G06F 3/016 |
| 2018/0032501 A1* | 2/2018 | Kamata | G06F 3/044 |

FOREIGN PATENT DOCUMENTS

| | | |
|---|---|---|
| EP | 2 963 523 A1 | 1/2016 |
| JP | 2016-015141 A | 1/2016 |
| WO | 2016/048207 A1 | 3/2016 |

OTHER PUBLICATIONS

Notice of Reasons for Refusal issued in Japanese Application No. 2017-221411 dated Jul. 18, 2019.

* cited by examiner

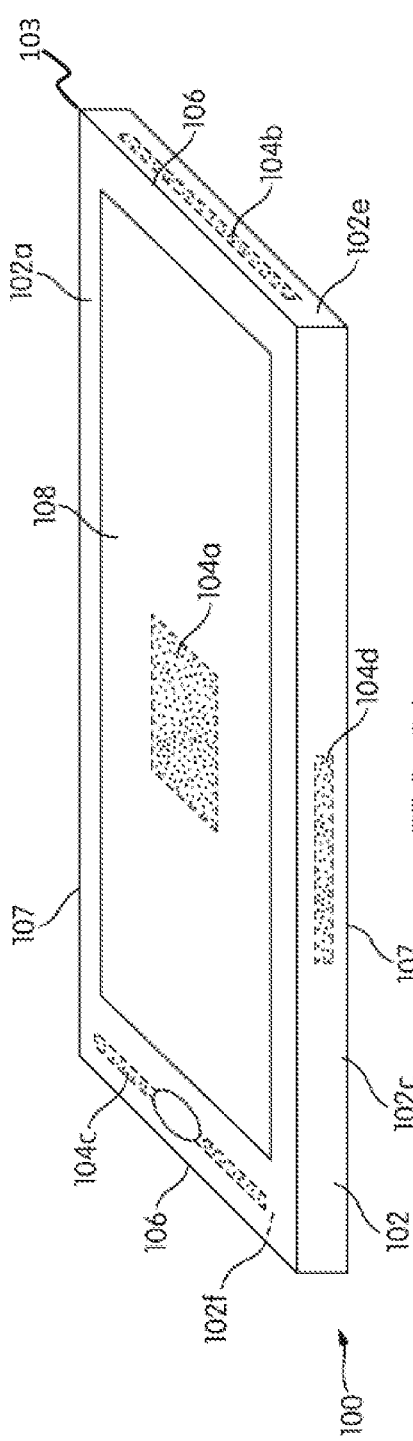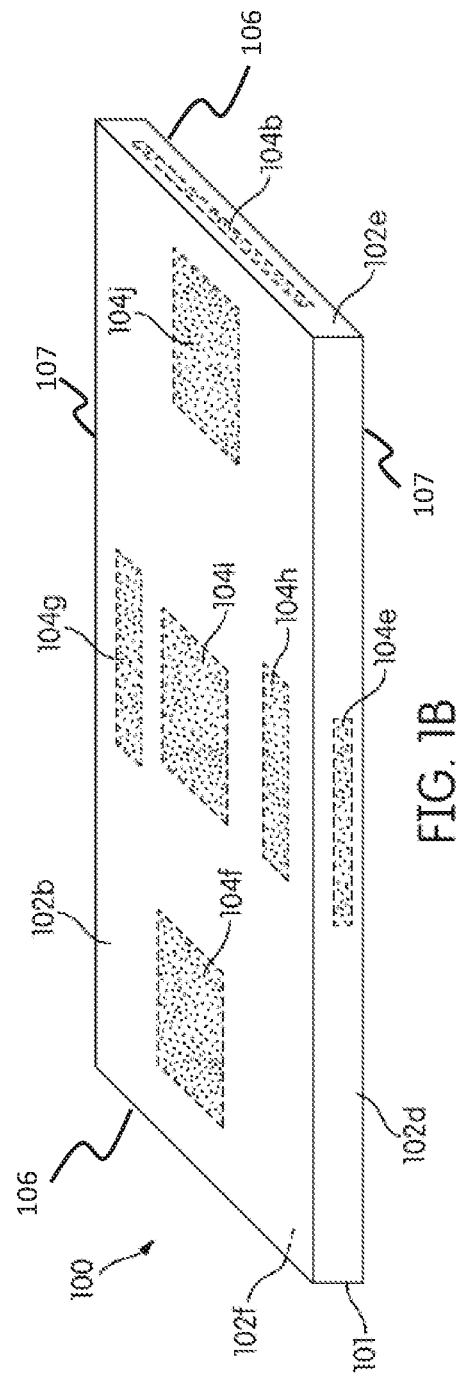
FIG. 1A
FIG. 1B

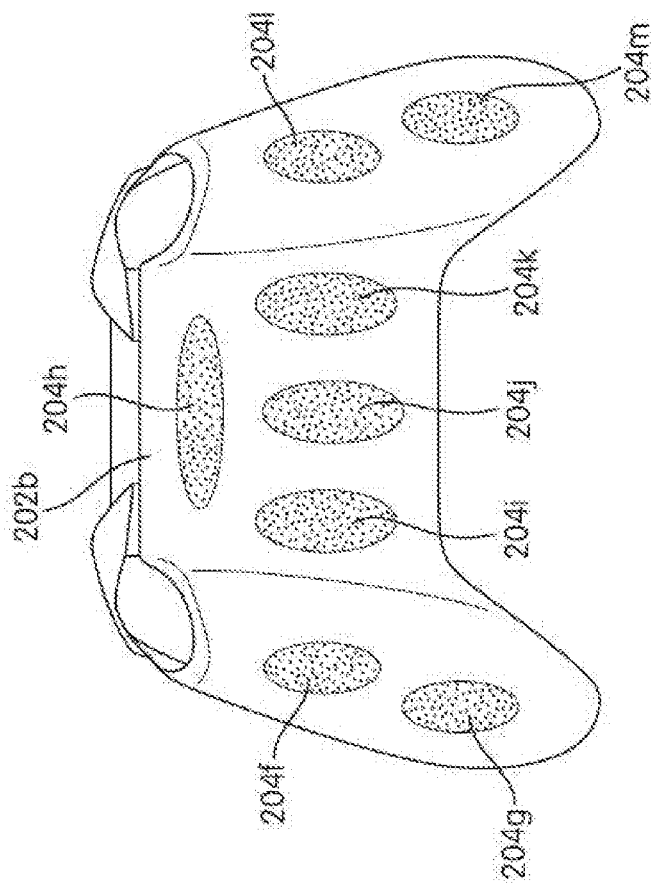
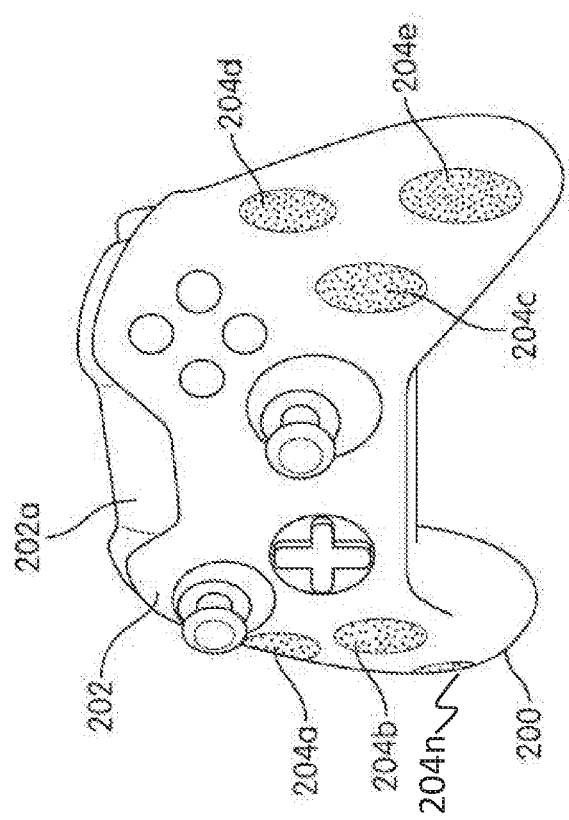
FIG. 2A
FIG. 2B

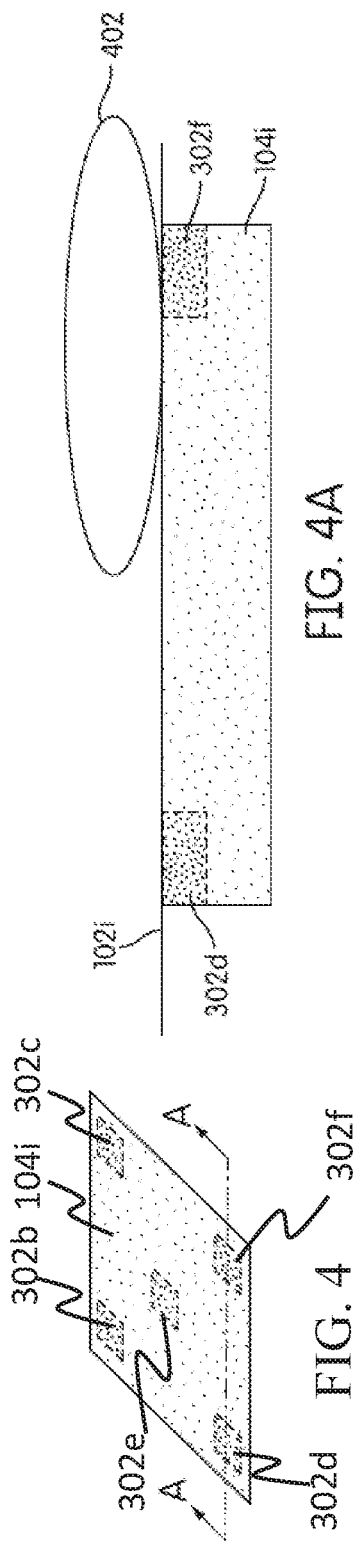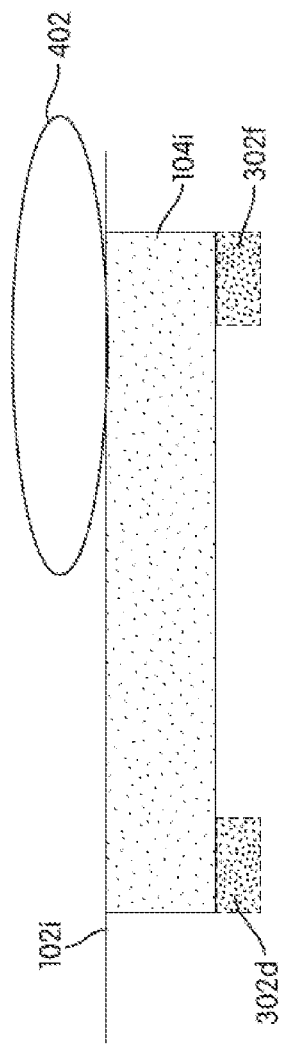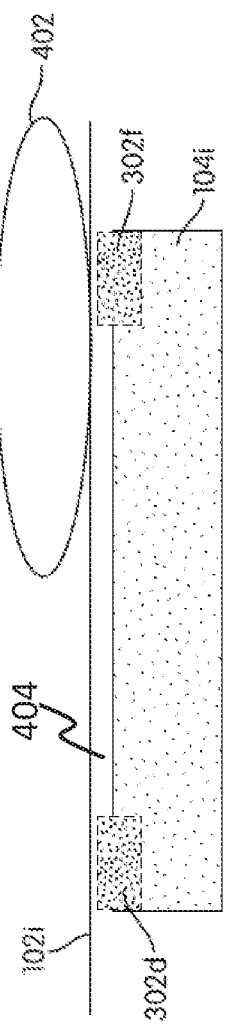
FIG. 4
FIG. 4A
FIG. 4B
FIG. 4C

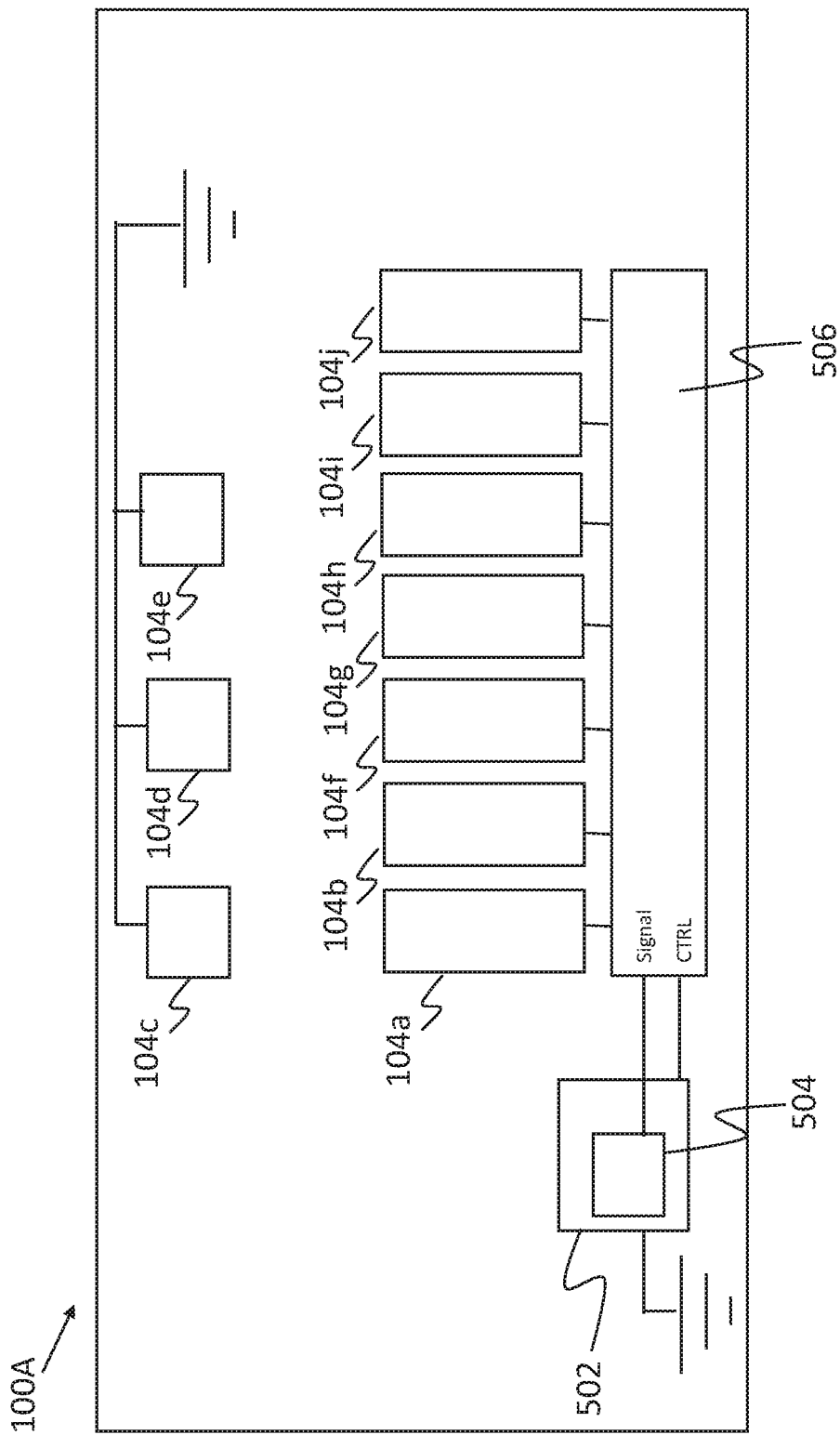

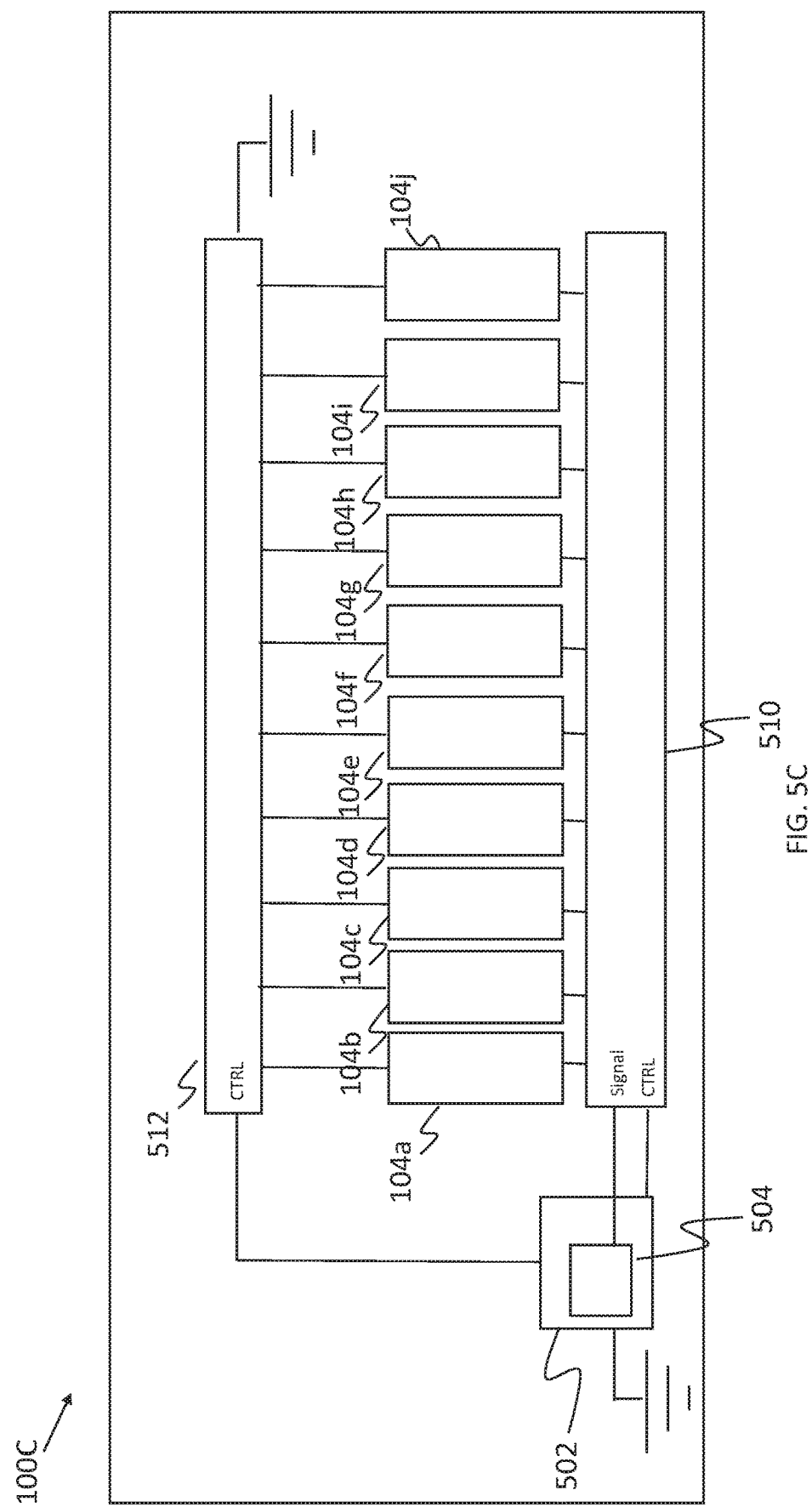

HANDHELD INTERFACE DEVICE HAVING A PLURALITY OF ELECTROSTATIC FRICTION (ESF) ELECTRODES

FIELD OF THE INVENTION

The present invention is directed to a handheld interface device having a plurality of electrostatic friction (ESF) electrodes, and has application in user interfaces, gaming, automotive, wearables, virtual reality or augmented reality, and consumer electronics.

BACKGROUND

As computer-based systems become more prevalent, the quality of the interfaces through which humans interact with these systems is becoming increasingly important. Haptic feedback, or more generally haptic effects, can improve the quality of the interfaces by providing cues to users, providing alerts of specific events, or providing realistic feedback to create greater sensory immersion within a virtual environment.

Examples of haptic effects include kinesthetic haptic effects (such as active and resistive force feedback), vibrotactile haptic effects, and electrostatic friction haptic effects. In electrostatic friction haptic effects, a current may be provided to an electrode. The electrode may then exert an attractive force on the skin of a user, who may perceive this force as electrostatic friction.

SUMMARY

One aspect of the embodiments herein relates to a handheld interface device configured to provide an electrostatic friction (ESF) effect. The handheld interface device comprises a plurality of electrodes and a control unit. Each electrode of the plurality of electrodes is separately disposed at a respective portion of an outer surface of the interface device, where each electrode of the plurality of electrodes is covered by the electrode's respective portion of the outer surface or forms the electrode's respective portion of the outer surface. The plurality of electrodes comprises more than two electrodes. The control unit is configured: (i) to determine a contact condition at each electrode of the plurality of electrodes, where the contact condition indicates whether user contact is detected at the respective portion of the outer surface that is formed by the electrode or that covers the electrode, and further indicates a quality level of any detected user contact at the respective portion of the outer surface, (ii) to select a subset of the plurality of electrodes based on the determined contact condition at each electrode of the plurality of electrodes, and (iii) to apply a drive signal for generating electrostatic friction to only one or more electrodes in the selected subset of the plurality of electrodes.

In an embodiment, the contact condition for each electrode of the plurality of electrodes indicates at least one of i) an area of any user contact at the respective portion of the outer surface formed by or covering the electrode, ii) an amount of pressure exerted by any user contact on the respective portion of the outer surface, iii) a pressure distribution of any user contact across the respective portion of the outer surface.

In an embodiment, the contact condition for one electrode of the plurality of electrodes whose respective portion of the outer surface is in contact with a user indicates at least one of i) a level of humidity of a portion of a user in contact with the respective portion of the outer surface formed by or covering the electrode and, ii) which location on a user is in contact with the respective portion of the outer surface.

In an embodiment, the plurality of electrodes are a plurality of insulated electrodes, each of which is switchable between being a signal electrode and a ground electrode, and wherein the control unit is configured to select the subset from the plurality of insulated electrodes by selecting at least two electrodes of the plurality of insulated electrodes that have the highest levels of any detected user contact.

In an embodiment, the control unit is configured to select at least one electrode of the subset of insulated electrodes as a ground electrode and to select remaining electrodes of the subset as signal electrodes, wherein the drive signal is applied to only the electrodes selected as signal electrodes.

In an embodiment, the subset of the plurality of insulated electrodes include electrodes of different sizes, and the control unit is configured to select the smallest electrode of the subset as the ground electrode.

In an embodiment, the control unit is configured to select more than one electrode of the plurality of insulated electrodes as signal electrodes.

In an embodiment, the plurality of electrodes includes a first set of insulated electrodes configured as signal electrodes, and a second set of exposed electrodes configured as ground electrodes, wherein the selected subset includes at least one signal electrode from the first set of insulated electrodes and at least one ground electrode from the second set of exposed electrodes, wherein the drive signal is applied to only the at least one signal electrode from the first set of insulated electrodes.

In an embodiment, the control unit is configured to determine the contact conditions for the plurality of electrodes based on at least one of i) measurements from a plurality of contact sensors configured to sense contact at respective ones of the plurality of electrodes, ii) measurements from the plurality of electrodes, iii) an identity of an application being executed on the handheld interface device or receiving input from the handheld interface device, and iv) stored or detected information indicative of users' hand sizes.

In an embodiment, the control unit is configured to determine a grip position indicating how the handheld interface device is currently being gripped, and to determine the contact conditions for the plurality of electrodes based on the determined grip position.

In an embodiment, the handheld interface device of claim further comprising: a display, and wherein the control unit is configured to determine the grip position based on whether an image is oriented in portrait mode or landscape mode on the display.

In an embodiment, the outer surface of the device comprises a front surface having a display or a user input component, and a back surface opposite the front surface, wherein the plurality of electrodes comprises an electrode at a center of the back surface and other electrodes located closer to an edge of the back surface.

In an embodiment, the interface device is a controller for a virtual reality (VR) application or augmented reality (AR) application.

In an embodiment, the drive signal applied to the subset of the plurality of electrodes has an amplitude of at least 1 kV.

One aspect of the embodiments herein relates to a handheld interface device configured to determine whether to provide an electrostatic friction (ESF) effect. The handheld interface device comprising a plurality of electrodes and a control unit. Each electrode of the plurality of electrodes is separately disposed at a respective portion of an outer surface of the interface device, where each electrode of the plurality of electrodes is covered by the electrode's respective portion of the outer surface or forms the electrode's respective portion of the outer surface, and where the plurality of electrodes comprises a first set one or more electrodes that are each a ground electrode or an electrode switchable to being a ground electrode, and a second set of one or more electrodes that are each a signal electrode or switchable to being a signal electrode. The control unit is configured: i) to determine a contact condition at each electrode of the plurality of electrodes, wherein the contact condition indicates whether user contact is detected at the respective portion of the outer surface that is formed by the electrode or that covers the electrode, ii) to determine, based on the contact condition at each electrode of the plurality of electrodes, that no user contact has been detected at the first set of one or more electrodes, or that user contact has been detected at only one electrode of the plurality of electrodes, and iii) in response to determining that no user contact has been detected at the first set of one or more electrodes or that user contact has been detected at only one electrode of the plurality of electrodes, disabling ESF effects on the handheld interface device by disabling all electrodes in the second set of one or more electrodes, wherein user contact is detected for at least one of the disabled one or more electrodes.

In an embodiment, the first set of one or more electrodes are each a ground electrode forming part of the outer surface of the interface device, and the second set of one or more electrodes are each switchably connected to a signal source and are covered by the outer surface of the interface device, and wherein the control unit is configured to disable ESF effects in response to determining that no user contact has been detected at the first set of one or more ground electrodes.

In an embodiment, the plurality of electrodes are each an insulated electrode that is switchable between being a signal electrode and a ground electrode, and wherein the control unit is configured to disable ESF effects in response to determining that user contact has been detected at only one electrode of the plurality of electrodes.

One aspect of the embodiments herein relates to a method of providing an electrostatic friction (ESF) effect for a handheld interface device, which comprises a plurality of more than two electrodes that are each separately disposed at a respective portion of an outer surface of the interface device and are each covered by the respective portion of the outer surface or forms the respective portion of the outer surface. The method comprises: (i) a control unit of the interface device determining a contact condition at each electrode of the plurality of electrodes, wherein the contact condition indicates whether user contact is detected at the respective portion of the outer surface that is formed by the electrode or that covers the electrode, and further indicates a high level of any detected user contact at the respective portion of the outer surface; (ii) the control unit selecting a subset of the plurality of electrodes based on the determined contact condition at each electrode of the plurality of electrodes; and (iii) the control unit applying a drive signal for generating electrostatic friction to only one or more electrodes in the selected subset of the plurality of electrodes.

One aspect of the embodiments herein relates to a method of providing an electrostatic friction (ESF) effect for a handheld interface device, which comprises a plurality of electrodes that are each separately disposed at a respective portion of an outer surface of the interface device and are each covered by the respective portion of the outer surface or forms the respective portion of the outer surface, the plurality of electrodes comprising a first set one or more electrodes that are each a ground electrode or switchable to being a ground electrode, and a second set of one or more electrodes that are each a signal electrode or switchable to being a signal electrode. The method comprises: (i) a control unit of the interface device determining a contact condition at each electrode of the plurality of electrodes, wherein the contact condition indicates whether user contact is detected at the respective portion of the outer surface that is formed by the electrode or that covers the electrode; (ii) the control unit determining, based on the contact condition at each electrode of the plurality of electrodes, that no user contact has been detected at the first set of one or more electrodes, or that user contact has been detected at only one electrode of the plurality of electrodes, and (iii) in response to determining that no user contact has been detected at the first set of one or more electrodes or that user contact has been detected at only one electrode of the plurality of electrodes, the control unit disabling ESF effects on the handheld interface device by disabling all electrodes in the second set of one or more electrodes, wherein user contact is detected for at least one of the disabled one or more electrodes.

Features, objects, and advantages of embodiments hereof will become apparent to those skilled in the art by reading the following detailed description where references will be made to the appended figures.

BRIEF DESCRIPTION OF THE DRAWINGS

The foregoing and other features and advantages of the invention will be apparent from the following description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIGS. 1A-1B are perspective views of a mobile device having a plurality of electrodes disposed at an outer surface of the mobile device and configured to generate electrostatic friction effects, according to an embodiment herein.

FIGS. 2A-2B are perspective views of a game controller having a plurality of electrodes disposed at an outer surface of the game controller and configured to generate electrostatic friction effects, according to an embodiment herein.

FIGS. 4 and 4A-4C show various arrangements of contact sensors disposed at an exposed electrode or an insulated electrode, according to an embodiment herein.

FIGS. 5A-5C show a functional diagram of a handheld interface device having a plurality of electrodes disposed thereon to generate an electrostatic friction effect, according to an embodiment herein.

DETAILED DESCRIPTION

Figure 3A:
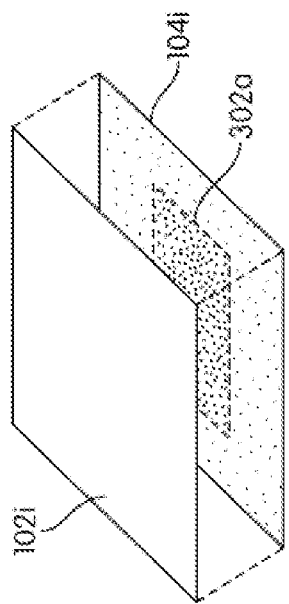
FIGS. 3A-3C show various arrangements of contact sensors disposed at an electrode, according to an embodiment herein.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Embodiments hereof relate to the use of multiple electrodes at respective locations (i.e., different locations) of an interface device, such as a handheld interface device (e.g. a mobile phone or game controller) or wearable device (e.g., wristband), for generating an electrostatic friction (ESF) effect, and to selecting which electrodes will be used to generate the ESF effect. The selection may be based on contact conditions at the respective locations of the multiple electrodes. The multiple electrodes may be used, e.g., to generate a static ESF effect or a dynamic ESF effect. Dynamic ESF effects may involve exerting electrostatic forces on a finger or other part of the user's body while the finger or other part of the user's body is moving on a surface of the interface device. The electrostatic forces may be created by applying a time-varying signal to an electrode. The electrostatic forces may attract the finger, and may be perceived as friction during the movement of the finger. Static ESF effects may be generated while the user's finger or other body part remains stationary on a surface of the interface device. Static ESF effects may also involve applying a time-varying signal to an electrode to create electrostatic forces. In some cases, static ESF may involve a higher voltage level for the time-varying signal compared to that for dynamic ESF. The electrodes used to create an ESF effect may be referred to as ESF electrodes. In some cases, the ESF electrode to which an electrical signal is being applied may be referred to as a signal electrode. In some cases, the creation of an ESF effect herein may also involve an electrode having a ground potential, which may be referred to as a ground electrode.

In many cases, the creation of an ESF effect may require a part of the user's body to be touching or otherwise contacting an ESF electrode or (if the ESF electrode is behind a surface) to be touching a part of a surface covering (e.g., disposed directly over) the ESF electrode. For a handheld interface device such as a mobile phone, this may involve placing the ESF electrode at a location where the electrode or a surface portion covering the electrode will likely come into contact with a finger, palm, or other body part of a user. For a wearables device such as a wristband, providing ESF effects may involve placing the ESF electrode at a location where the electrode or a surface portion covering the electrode will likely come into contact with the wrist or other body part of a user. However, selecting the placement of an electrode on a handheld interface device or other interface device for purposes of providing ESF effects is not trivial, because the locations on the device where a user is likely to contact may vary based on, e.g., grip posture, hand size, and/or an application running on or otherwise interacting with the device. Thus, the optimal locations for placing an ESF electrode may be difficult to predict. If a user contacts a location of a device at which there is no ESF electrode, then ESF effects may be unavailable on the device. Even if the user does contact that location, if the contact is minimal or otherwise poor, the ESF effect may have poor quality. Further, in some instances an ESF may be poor if a user is not in contact with both a signal electrode and a ground electrode, or respective surface portions thereof. Thus, if the user contacts a location at which there is a signal electrode, but does not also contact a location at which there is a ground electrode, the ESF effect may also have poor quality.

In one example, a handheld interface device such as a mobile phone can be held in a portrait orientation for, e.g., reading a website, and can be held in a landscape orientation for, e.g., watching a video. The grip postures for these respective orientations may differ. In the portrait orientation, a user may be more likely to grip a rectangular phone or tablet at its longer edges and at its back surface. Further, if the handheld interface device were a phone, the user may be more likely to grip the phone with just one hand (e.g., using all five fingers on the one hand). In the landscape orientation, a user may be more likely to grip the handheld interface device at its shorter edges. The user may be more likely to use both hands (e.g., using only the thumb and index finger on each hand) to grip the device in the landscape orientation. As another example, a game controller may make contact with different regions of a user's hand depending on the size of the hand, the preferred grip of the user, or the game being played. Different grip postures are illustrated later in more detail. Hand size may also affect where a handheld device is contacted. In one instance, an adult gripping a game controller may have a bigger hand size and may be more likely to reach a center of the back surface of the game controller, while a child may have a smaller hand size and may be less likely to reach that region. These variations among users and use cases may thus need to be considered in providing ESF effects.

Embodiments hereof relate to providing ESF effects (e.g., static ESF effects) by disposing a plurality of electrodes at respective portions of an outer surface of a handheld interface device, determining a contact condition at the plurality of electrodes, selecting a subset of the electrodes based on the determined contact conditions, and using the selected electrodes to generate an ESF effect. The electrodes which are not selected may be disabled. The placement of a plurality of electrodes at respective portions on the handheld devices creates redundancy that improves the availability and/or quality of ESF effects. That is, this placement provides multiple electrodes that may each be configured to generate an ESF effect. Even if some electrodes are placed at locations which are not in contact, or not in optimal contact, with a user in a particular instance, those electrodes may not be necessary because there may be other electrodes which are placed at locations that are in contact with the user in that instance. As a result, the availability and robustness of ESF effects may be enhanced.

In an embodiment, the plurality of electrodes disposed at respective portions of the outer surface may include exposed electrodes and/or insulated electrodes. An exposed electrode may be exposed to direct contact from a user or other object, and may thus form that respective portion of the outer surface of the interface device. When a user touches the respective portion of the outer surface formed by the electrode, the user's body may be directly electrically connected to the electrode. Examples of an exposed electrode include a dry electrode and a wet electrode. An exposed dry electrode may be exposed to the outside, or an exterior, of the interface device, while an exposed wet electrode may be formed by applying conductive gel to an exposed dry electrode. An insulated electrode may be, e.g., an electrode which is separated from an outer surface of the handheld interface device by an electrically insulating material, so that the electrode is covered by a respective portion of the outer surface of the interface device, and is not exposed to direct contact with a user's finger or other object. For instance, an insulated electrode may be an electrode disposed behind a respective portion of an outer surface of the interface device. The insulated electrode may be disposed behind the outer surface of the interface device by being, e.g., encapsulated within a plastic outer cover of a mobile phone or game controller during the manufacturing or assembly thereof, or disposed on an inner surface of the plastic outer cover during the manufacturing or assembly thereof, such that there is an electrically insulating material (e.g., a dielectric material) between the electrode and the outer surface of the mobile phone or game controller. In some cases, an electrode may initially be exposed during the manufacturing or assembly process, and may then be converted to an insulated electrode when insulating material (e.g., plastic cover or a piece of insulating tape) is placed over the electrode. This conversion may be performed by a device manufacturer as part of the manufacturing or assembly process, or may be performed by another entity that acquires the device from the manufacturer. While the insulated electrode is, e.g., an electrode having an insulating material that covers the electrode, the insulating material may optionally be covered as well by another material. For example, an insulated electrode may be covered by a dielectric layer, and the dielectric layer may be covered by an aluminum casing that forms an outer cover of a mobile phone (e.g., an HTC One® phone) or handheld controller. When a user touches a respective outer surface portion that covers an insulated electrode, the user may be capacitively electrically coupled to the insulated electrode.

In some cases, the plurality of electrodes disposed at respective portions of the outer surface of the handheld interface device may include more than two electrodes (e.g., more than one signal electrode and one ground electrode). Increasing the number of electrodes, and thus increasing the number of respective portions of the outer surface at which an electrode is disposed, increases the likelihood that a user's hand or other body part will contact one of those respective portions when the user grips the handheld device. This creates a redundancy in the provision of electrodes that increases the likelihood that a user will be electrically coupled with at least one signal electrode and at least one ground electrode regardless of grip posture, hand size, application, etc. Further, increasing the number of portions of the outer surface at which an electrode is disposed may also increases the likelihood that a user's hand or other body part will be in contact with many of those portions simultaneously. This provides more eligible electrodes for generating an ESF effect, and thus may afford the ability to select among those electrodes for generating the ESF effect, as some electrodes may produce better static ESF effects than other electrodes. For example, the electrodes may contact the user's hand with varying respective contact areas, receive varying respective levels of received force or pressure from the user's hand, or varying respective levels of other contact conditions. The electrodes with the best contact conditions may be selected to be one or more signal electrodes and one or more ground electrodes for generating the ESF effect. The electrodes with the best contact conditions may be those with the highest quality, or highest levels, of contact, such as the greatest contact areas, highest levels of force or pressure, or some other condition. The electrodes which are not selected may be disabled or otherwise unused to save power, improve safety, or for any other reason. In some instances, however, if it is determined that the contact condition for all electrodes, or more specifically for all ground electrodes, is poor, ESF effects may be disabled in the device.

FIGS. 1A and 1B show perspective views of a handheld interface device 100 (e.g., a mobile phone or tablet computer) configured to provide an electrostatic friction (ESF) effect to a user. In an embodiment, the handheld interface device 100 may have a touch screen 108 and may have no physical user input component or only one physical user input component (e.g., a physical home button). The handheld interface device 100 may have an outer surface 102, which may include a front surface 102a having a display (e.g., touch screen), a back surface 102b opposite the front surface 102a, and side surfaces 102c-102f In embodiments in accordance herewith, all or portions of the front, back and side outer surfaces 102a-102f may be formed or defined by a body or casing 103 of the device 100, with at least a portion of the front outer surface 102a being formed or defined by the touch screen 108 or another touch surface. The device 100 may have a plurality of electrodes (e.g., electrodes 104a-104j), with each electrode of the plurality of electrodes being separately disposed at a respective portion of the outer surface 102 of the interface device 100. The electrodes 104a-104j may be configured to generate an ESF effect, and may be referred to as ESF electrodes. In an embodiment, each electrode may be a conductive (e.g., metal) pad. In an embodiment, the plurality of electrodes 104a-104j may be exposed electrodes and/or insulated electrodes, as discussed later with respect to FIGS. 4A-4C. Returning to FIG. 1A, an exposed electrode may be disposed at a respective portion of the outer surface 102, and more specifically may form the respective portion of the outer surface 102. The exposed electrode may, e.g., be configured to be directly electrically coupled to a user upon the user making contact with the exposed electrode at the respective portion of the outer surface 102. The contact may refer to contact with, e.g., the user's skin. More generally speaking, making contact or contact may refer to contact in which a drive signal can create an electrostatic friction effect on the user's body. In one example, an exposed electrode may be a conductive pad adhered on top of the casing or body 103 of the handheld interface device 100. In one example, the exposed electrode may be a conductive pad exposed through an opening in the casing 103 of the handheld interface device 100.

In an embodiment, an insulated electrode may be disposed at a respective portion of the outer surface 102 of the interface device 100, and more specifically may be disposed directly behind a respective portion of the outer surface 102 such that the respective portion of the outer surface 102 covers the insulated electrode. For instance, the electrode may be insulated by being separated from the outer surface 102 by a thin insulating layer, such as a layer of dielectric material. The insulated electrode may be configured to be capacitively electrically coupled to a user upon the user making contact with the insulated electrode's respective portion of the outer surface 102.

In an embodiment, the handheld interface device 100 includes signal electrodes and ground electrodes. In some instances, a signal electrode may be an electrode electrically connected to the output of a signal source (e.g., AC signal source) configured to generate an ESF signal (e.g., a 1.5 kilovolt sinusoidal signal). In some instances, a ground electrode may be an electrode electrically connected to a ground potential (e.g., a ground potential as being equal to the potential of the negative terminal of the battery or other power source of the handheld interface device 100). The electrical connection may be selectively switched, or may be permanent. In some embodiments in which static ESF effects are generated, only an insulated electrode can be used as a signal electrode, while an insulated electrode or an exposed electrode (if any) can be used as a ground electrode. In some cases, an insulated electrode is switchable between being a signal electrode and a ground electrode (e.g., interchangeably used as a signal electrode at one point in time or as a ground electrode at another point in time).

In embodiments hereof, the handheld interface device 100 has more than two electrodes, such as the ten electrodes 104a-104j in FIGS. 1A and 1B, or more or fewer electrodes. The electrodes may have any shape, such as a rectangular (e.g., square) or circular shape. Each of the electrodes may have the same size (e.g., same dimensions or same area), or may have different sizes. For instance, electrodes 104a, 104f, 104i, 104j may have the same size, while electrodes 104g and 104h may have different sizes.

As discussed above, the electrodes on a handheld interface device may include exposed electrodes and/or insulated electrodes. In FIGS. 1A and 1B, for example, electrodes 104a-104j may all be insulated electrodes, or a mixture of insulated electrodes and exposed electrodes. In some instances in which the device 100 includes a mixture of insulated electrodes and exposed electrodes, the insulated electrodes may be dedicated to being used only as signal electrodes, while the exposed electrodes may be dedicated to being used only as ground electrodes. In some instances in which the device 100 includes only insulated electrodes, each of the insulated electrodes may be switchable between being a signal electrode and being a ground electrode.

In FIGS. 1A and 1B, the outer surface 102 may be divided into six surfaces 102a-102f, which as noted above correspond to the front, back, and sides of the handheld interface device 100. The electrodes 104a-104j may be placed on, e.g., five of the six surfaces. For example, electrode 104a may be an insulated signal electrode embedded in or placed behind a touchscreen 108 (which forms a portion of the front surface 102a), while electrodes 104b-104i may be insulated electrodes switchable between being signal electrodes or ground electrodes, and electrode 104j may be an exposed ground electrode.

As also discussed above, the electrodes 104a-104j may be disposed at respective locations of the outer surface 102. In one example, the plurality of electrodes may comprise an electrode at a center of the back surface 102b and other electrodes located closer to a short edge 106 or a long edge 107 of the back surface. For instance, each of electrodes 104a, 104b, 104d, 104e, and 104i may be placed at a respective center of surfaces 102a, 102e, 102c, 102d, and 102b. Electrodes 104f and 104j may be located closer to one of the short edges 106 of the interface device 100, while electrodes 104g and 104h may be located closer to one of the long edges 107 of the device 100. In some cases, the electrodes may be placed at locations that are anticipated to cover respective orientations or grip postures of the handheld interface device 100, such as a portrait/vertical orientation and a landscape/horizontal orientation. In a portrait orientation, one or more of electrodes 104a, 104c, 104d, 104e, 104g, 104h (or their respective portions of the outer surface) may be more likely to receive user contact from a user's hand gripping the handheld interface device 100. In a landscape orientation, one or more of electrodes 104a, 104b, 104f, 104i, 104j (or their respective portions of the outer surface) may be more likely to receive user contact from a user's hand gripping the handheld interface device 100.

In some cases, the electrodes 104a-104j may be placed at locations that correspond to different hand sizes. For example, electrode 104i may correspond to a bigger hand size that is more likely to touch a center of the back surface 102b. Electrodes 104g and 104h may correspond to a smaller hand that might be less likely to reach the center of the back surface 102b. Thus, electrodes 104g and 104h may be located closer to a long edge 107 of the back surface 102b.

FIGS. 2A and 2B show an example of a handheld interface device 200 (e.g., a handheld game controller) that has a plurality of electrodes 204a-204n disposed at respective portions of an outer surface 202 of the interface device 200. The handheld interface device 200 may include a plurality of user input components, such as thumb sticks, push buttons, and trigger buttons. The outer surface 202 may be divided into at least a front surface 202a and a back surface 202b. In an embodiment, electrodes 204a-204e, 204n may be disposed at respective portions of the front surface 202a, while electrodes 204f-204m may be disposed at respective portions of the back surface 202b. In some cases, the distance between adjacent electrodes may be substantially the same. In some cases, one of the electrodes 204a-204n may be located at a portion at which a physical input component (e.g., thumbstick) is located. In some cases, there is no ESF electrode disposed at any physical input component. In an embodiment, the electrodes 204a-204n may all be insulated electrodes, or may be a combination of, e.g., insulated signal electrodes and exposed ground electrodes.

In FIGS. 2A and 2B, the electrodes 204a-204n may be placed at locations corresponding to different hand sizes. For example, electrodes 204a, 204b, 204c, 204d, 204f, 204l, and 204j (or their respective portions of the outer surface 202) may correspond to locations that are more likely to be touched by a grip of a user having a bigger hand size. Electrodes 204e, 204g, 204m, 204i, 204k, and 204n may correspond to locations that are more likely to be touched by a grip of a user having a smaller hand size.

As discussed below in more detail, a contact condition at each of the plurality of ESF electrodes (e.g., each electrode of electrodes 104a-104j or 204a-204n) may be determined. The contact condition may indicate whether a user is in contact with a respective portion of the outer surface that is formed by the electrode or that covers the electrode, or more specifically whether user contact is detected at the respective portion of the outer surface. For example, FIG. 3A shows electrode 104i as an insulated electrode covered by a respective portion 102i of the outer surface 102 of the handheld interface device 100. In some cases, the respective portion 102i may be the portion of the outer surface 102 which is disposed directly over the electrode 104i, and may have the same dimensions and boundaries as the electrode 104i. The contact condition for electrode 104i may indicate at least whether a user is in contact with the respective portion 102i of the outer surface 102. For instance, the contact condition may be represented through a binary value that indicates whether the user's finger or other body part is in contact with the respective portion 102i. In some instances, the contact condition may indicate a degree of contact, if any, with the respective portion 102i. The degree of contact may be represented through a value indicating an area of the respective portion 102i that is in contact with the user, a level of pressure being exerted by the user's contact on the respective portion 102i, or some other value.

In embodiments hereof, the contact condition may be determined by inference (assumptions concerning the contact based on various criteria), by direct measurement with an electrode itself or with a separate sensor, or by some other technique. As discussed later in more detail, inferring the contact condition may involve inferring how the handheld interface device is being gripped (e.g., a grip posture). This inference may be based on various criteria or data, e.g., what application is running on a mobile phone or what game is being played with a game controller, or on an age of a user of the device. In some cases, determining a contact condition may involve inferring whether, e.g., a mobile device is being held in a portrait orientation or a landscape orientation, and then identifying based on that inferred orientation which electrodes or their respective surface portions are likely to be in contact with a user.

For embodiments in which a contact condition is sensed through an electrode itself, the presence of the user's skin on the respective portion 102$i$ may affect (e.g., diminish) a signal (e.g., AC voltage) applied to electrode 104$i$ by capacitively drawing current via the electrode 104$i$. Thus, by using a signal source to output a driving signal to the electrode 104$i$ and measuring whether the current drawn from electrode 104$i$ is more than a threshold amount (e.g., by measuring whether the signal at electrode 104$i$ diminishes by more than a threshold amount compared to the outputted signal), the presence of a user's hand or other body part at the respective portion 102$i$ can be detected. This driving signal used for measurement may be substantially lower in amplitude (e.g., 10 mV) than that used to generate a static ESF effect.

Figure 3B:
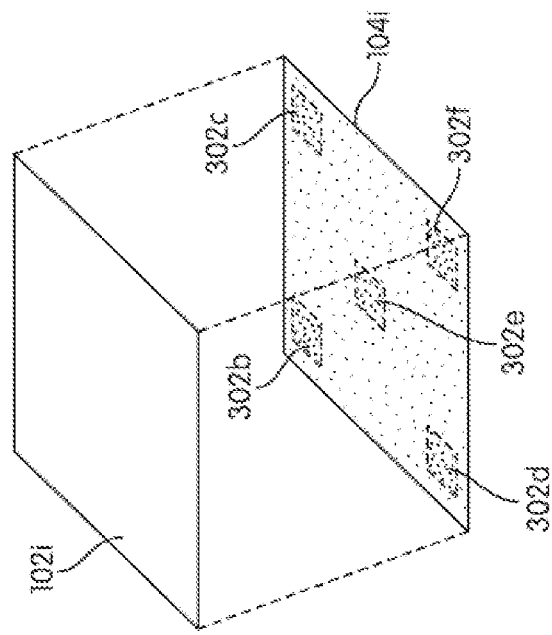
Figure 3C:
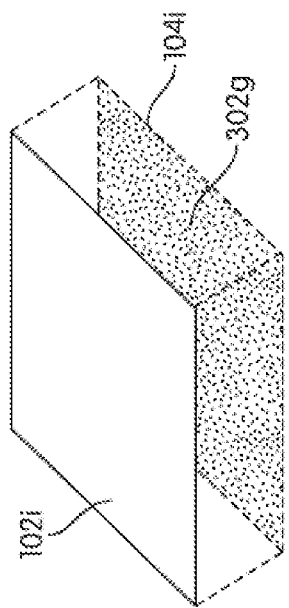

In an embodiment, a contact condition may be sensed through a contact sensor, such as a pressure sensor, a capacitive sensor, a resistive sensor, a piezoelectric sensor, any other contact sensor, or any combination thereof. FIGS. 3A-3C show contact sensors 302$a$-302$g$. In FIG. 3A, a single contact sensor 302$a$ may be used to sense a contact condition at the electrode 104$i$. In one example, the contact sensor 302$a$ may be a pressure sensor. The pressure sensor maybe configured, for instance, to output an amount of pressure being transferred from the respective portion 102$i$ of the outer surface to the pressure sensor, or it may be configured to output a binary value indicating whether a threshold amount of pressure on the respective portion 102$i$ has been detected. In another example, contact sensor 302$a$ may be a capacitive sensor configured to sense the presence of a user's skin at the respective portion 102$i$.

In FIG. 3B, a plurality of contact sensors (e.g., pressure sensors, capacitive sensors) 302$b$-302$f$ may be located at electrode 104$i$. In some cases, the plurality of contact sensors may collectively measure an area of the respective portion 102$i$ that is in contact with a user, and/or a distribution of the contact. For example, the plurality of contact sensors 302$b$-302$f$ may be used to estimate a percentage of the respective portion 102$i$ that is in contact with a user. If only, e.g., contact sensors 302$b$ and 302$d$ detects contact on the respective portion 102$i$, it may be determined that only the left 40% of the respective portion 102$i$ is in contact with a user. The plurality of contact sensors 302$b$-302$f$ may be arranged in various configurations, such as a staggered 2D array, as shown in FIG. 3B.

In FIG. 3C, the contact sensor 302$g$ may have the same dimensions and boundaries as the electrode 104$i$, and may cover or be covered by the electrode. In an embodiment, the contact sensor 302$g$ may be a pressure sensor similar in functionality to contact sensor 302$a$ in FIG. 3A. In an embodiment, the contact sensor 302$g$ may be a contact sensor configured to measure whether a user is in contact with the respective portion 102$i$ covering the electrode 104$i$. In some instances, the output of the contact sensor 302$g$ may depend on a percentage of the respective portion 102$i$ that is in contact with the user.

FIGS. 4A-4C show various sectional views, along the cross-sectional line A-A of FIG. 4, of an electrode 104$i$ and contact sensors 302$d$ and 302$f$. FIG. 4A shows a sectional view in which electrode 104$i$ is an exposed electrode that may be electrically coupled to a finger 402 through direct contact. In this embodiment, contact sensors 302$d$ and 302$f$ may also be exposed, and thus may be considered to form a segment of the outer surface portion 102$i$. In other embodiments, the depth of the contact sensors' placement may vary. For example, FIG. 4B shows an embodiment in which the contact sensors 302$d$ and 302$f$ are located under the electrode 104$i$. FIG. 4C shows an embodiment in which electrode 104$i$ is an insulated electrode that is covered by the respective portion 102$i$ of the outer surface 102 of the handheld interface device 100, which has an insulating layer 404 separating the electrode 104$i$ from the outer surface 102. In this embodiment, the contact sensors 302$d$ and 302$f$ may also be insulated by the insulating layer 404 from direct contact with the finger 402, but may be located closer to the outer surface 102$i$. In some cases, the placement of the contact sensors 302$d$, 302$f$ may depend on the type of the contact sensor. For example, if the contact sensors 302$d$, 302$f$ were pressure sensors, they may be exposed to the outer surface 102 (like in FIG. 4A) or placed under the electrode 104$i$ (like in FIG. 4B). If the contact sensors 302$d$, 302$f$ were capacitive sensors, they may have the placement shown in FIG. 4B or 4C.

Figure 5B:
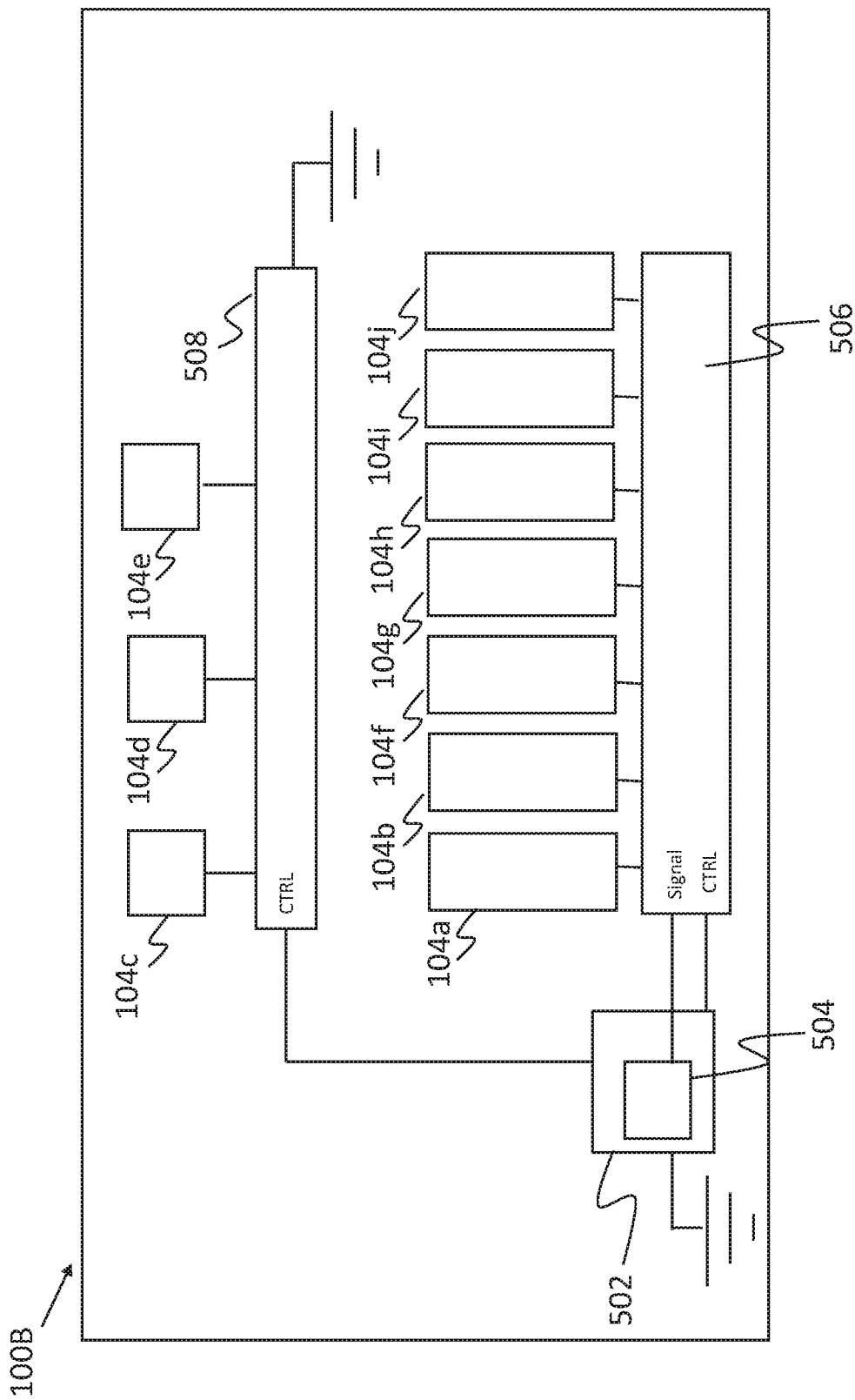

FIGS. 5A-5C are block diagrams showing examples of electrodes being signal electrodes or ground electrodes in handheld interface devices 100A-100C, respectively. FIGS. 5A and 5B both show a handheld interface device 100A and 100B, respectively, that has a first set of electrodes (104$a$, 104$b$, 104$f$, 104$g$, 104$h$, 104$i$, 104$j$) that are dedicated to being signal electrodes, and a second set of electrodes (electrodes 104$c$, 104$d$, 104$e$) that are dedicated to being ground electrodes. The first set of electrodes may be dedicated to being signal electrodes in the sense that they can be used as signal electrodes (e.g., can be switchably connected to a signal generator), but cannot be used as ground electrodes. The second set of electrodes may be dedicated to being ground electrodes in the sense that they can be used as ground electrodes (e.g., permanently or switchably connected to ground), but cannot be used as signal electrodes. In FIGS. 5A and 5B, the driving signal for an ESF effect may be generated by a signal generating circuit 504 that is part of a control unit 502 of the handheld interface device 100A, 100B. In an embodiment, the signal generating circuit 504 may comprise a low-voltage digital to analog converter (DAC) and an amplifier which is configured to amplify the output of the DAC to a high voltage (e.g., 1.5 kV). The output of the signal generating circuit 504 may be selectively electrically connected to one or more electrodes of the first set of electrodes (104$a$, 104$b$, 104$f$, 104$g$, 104$h$, 104$i$, 104$j$) by a switching device 506 (e.g., a multiplexor). The switching device 506 may be controlled by control unit 502. Thus, each electrode in the first set of electrodes (104$a$, 104$b$, 104$f$, 104$g$, 104$h$, 104$i$, 104$j$) in FIGS. 5A and 5B may be switchable to being a signal electrode. Electrodes in the first set which are not electrically connected to the output of the signal generating circuit 504 by the switching device 506 may be in an electrically floating state (i.e., have a floating electrical potential).

In FIG. 5A, each electrode in the second set of electrodes (104c, 104d, 104e) may be a dedicated ground electrode permanently electrically connected to a ground potential. In FIG. 5B, each electrode in the second set of electrodes (104c, 104d, 104e) may be dedicated to being a ground electrode, and is switchable between being electrically connected to the ground potential by switching device 508 and being in an electrically floating state. The switching device 508 may be controlled by the control unit 502.

FIG. 5C provides a block diagram of a handheld interface device 100C that includes a plurality of electrodes (104a-104j) that may each be an electrode (e.g., insulated electrode) switchable between being a signal electrode and being a ground electrode. An electrode in the plurality of electrodes may be switched to being a signal electrode by being electrically connected to an output of the signal generating circuit 504. In an embodiment, a switching device 510 (e.g., a multiplexor) may be configured to electrically connect one or more of the electrodes 104a-104j to the output of the signal generating circuit 504. In an embodiment, a switching device 512 (e.g., a multiplexor) may be configured to electrically connect one or more electrodes of the plurality of electrodes 104a-104j to a ground potential. Both the switching device 510 and the switching device 512 may be controlled by the control unit 502. In an embodiment, the switching device 510 and the switching device 512 may both be part of a single switching device. In one example, electrodes which are not electrically connected to the output of the signal generating circuit 504 nor to the ground potential may be in an electrically floating state. In an embodiment, an electrode in FIG. 5A, 5B, or 5C that is a signal electrode or switchable to being a signal electrode may be considered disabled from being a signal electrode if it is in the electrically floating state, or is grounded. In an embodiment, an electrode in FIG. 5B or 5C that is switchable to being a ground electrode may be considered disabled from being a ground electrode if it is in the electrically floating state.

Figure 6:
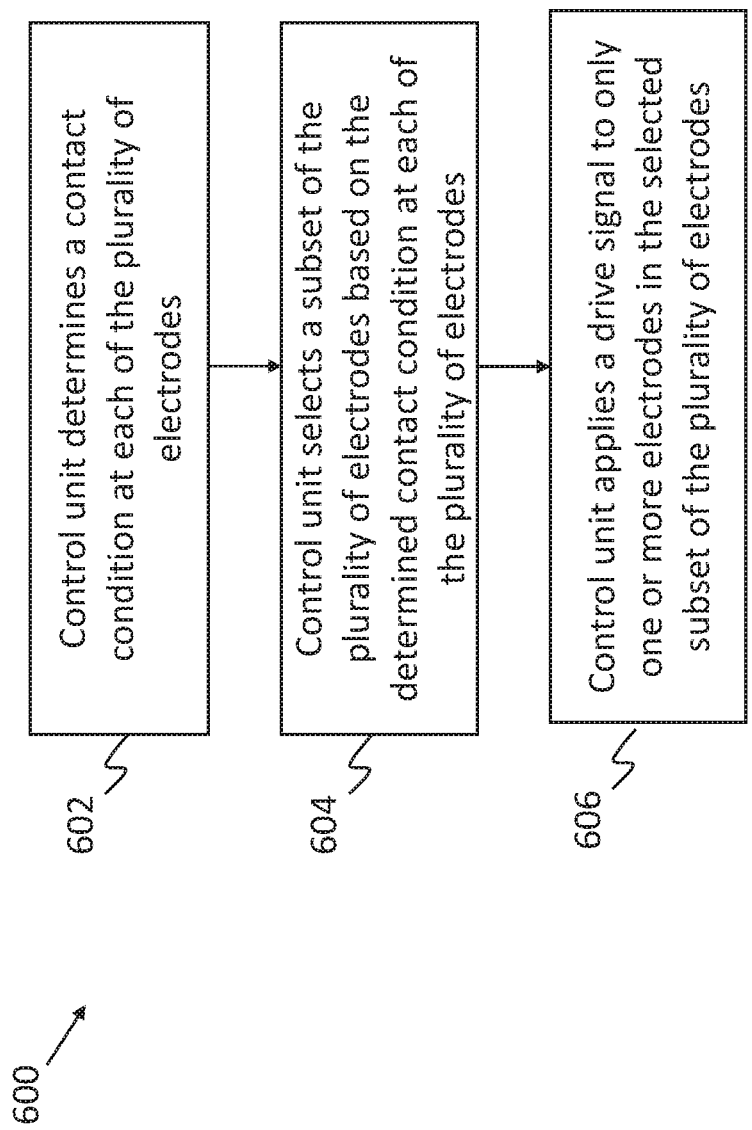
FIG. 6 provides a flow diagram of an example method for selecting electrodes to generate an electrostatic friction effect on a handheld interface device, according to an embodiment herein.

FIG. 6 provides a flow diagram which illustrates example steps of a method 600 by which a handheld interface device provides an electrostatic friction (ESF) effect (e.g., static ESF) to a user, and involves the selection of electrodes based on contact conditions. The handheld interface device (e.g., device 100) may comprise a plurality of electrodes (e.g., more than two electrodes), with each electrode (e.g., electrode 104i) of the plurality of electrodes being separately disposed at a respective portion (e.g., portion 102i) of an outer surface of the interface device. Each electrode of the plurality of electrodes may be an exposed electrode or an insulated electrode that is covered by or forms the electrode's respective portion of the outer surface. The electrode may be configured to be electrically coupled, directly or capacitively, with the user upon the user making contact with the electrode's respective portion of the outer surface. In an embodiment, method 600 begins at step 602, in which a control unit of the handheld interface device determines a contact condition at each electrode (e.g., electrode 104i) of the plurality of electrodes (e.g., electrodes 104a-104j). The contact condition may indicate whether user contact has been detected at the respective portion (e.g., 102i) of the outer surface that is formed by the electrode or that covers the electrode. In some instances, the determined contact condition for each electrode of the plurality of electrodes may indicate a quality level of any detected user contact at the respective portion of the outer surface.

In an embodiment, the contact condition for an electrode (e.g., 104i) may indicate at least one of: i) an area of any user contact at the respective portion (e.g., 102i) of the outer surface formed by or covering the electrode (the strength of the sensation may increase with the area of contact), such as via an array of contact sensors; ii) an amount of pressure exerted by any user contact on the respective portion (e.g., 102i) of the outer surface (the sensation may be weaker when too much or too little pressure is applied), such as via a pressure sensor or via calculation based on bending of the outer surface 102 or (if the method 600 were applied to a wearable device such as a wrist band) tightness of the band; and iii) a pressure distribution of any user contact across the respective portion of the outer surface. In one example, the contact condition for an electrode (e.g., 104i) whose respective portion of the outer surface in contact with a user indicates at least one of: i) a level of humidity of a portion of a user in contact with the respective portion of the outer surface formed by or covering the electrode (the sensation may be strongest when the humidity of the skin in contact with the portion is in a certain range), such as with a corneometer or other sensor, and, ii) which location on a user (e.g., hand, wrist, or arm) is in contact with the respective portion of the outer surface, such as via sensor data. For example, a dry ground electrode may function adequately against a palm or finger, but may cause a burning sensation on the wrist.

In an embodiment of step 602, the control unit may be configured to determine the contact conditions for the plurality of electrodes based on at least one of: i) measurements from a plurality of contact sensors configured to sense user contact at respective ones of the plurality of electrodes; ii) measurements from the plurality of electrodes; iii) an identity of an application being executed on the handheld interface device or receiving input from the handheld interface device; and iv) stored or detected information indicative of a hand size of a user using the handheld interface device.

In an embodiment of step 602, the control unit is configured to determine a grip position indicating how the handheld interface device is currently being gripped, and to determine the contact conditions for the plurality of electrodes based on the determined grip position. For instance, the handheld interface device may comprise a display (e.g., touch screen 108), and the control unit may be configured to determine the grip position based on whether an image is oriented in portrait mode or landscape mode on the display.

As discussed above, the contact sensors may be used to detect user contact with the interface device. In an embodiment, the sensors could be placed on or under the electrodes to directly detect contact. The contact sensors can detect contact, pressure, pressure distribution, and whether the object making contact is skin. In an embodiment, sensors (e.g., contact sensors or sensors other than contact sensors) could also be placed on other parts of the device and used to infer user contact with the electrodes. Contact sensors could include capacitive sensors, pressure sensors, or any other contact sensor.

In step 602, the use of the identity of the application or the stored or detected information may be part of inferring a contact condition at an electrode. For instance, this inference may involve estimating whether the respective location of a particular electrode is likely to be in user contact, or estimating a degree of user contact, based on information indicating how the interface device is being held by a user, information about the user holding the interface device, and/or other information. The identity of the application running on a mobile phone, for instance, may indicate a grip posture (e.g., whether the phone is being held in a portrait orientation or a landscape orientation). For example, the grip posture of a mobile phone may vary based on whether the application involves a keyboard typing task (which more typically involves a landscape orientation), involves a game with virtual buttons, involves a video such as a Netflix stream, involves a game for a child versus an adult (which may be used to infer hand size), etc. The grip posture inferred from the identity of the application may map to a particular subset of electrodes whose respective surface portions were previously determined as likely to contact a user in that grip posture.

In step 602, the detected or stored information may be used to infer a hand size, preferred grip posture, etc. In an embodiment, the information may include demographic information about a current user of the device. For instance, a game console may have the profile of a player, such as gender and/or age. This information may be used to estimate the hand size and likely grip of a game controller. In an embodiment, the information may be detected by asking the user to explicitly pick a hand size (e.g., between small, medium, large), or by measuring the user's hand, such as by comparing an image of the user's hand to a template (e.g., different hand sizes shown on a tablet computer).

In step 604, the control unit may select a subset of the plurality of electrodes based on the determined contact condition at each electrode of the plurality of electrodes. For instance, a control unit (e.g., control unit 502) may select an electrode with the best contact condition, which may be, e.g., the largest contact area, the most uniform pressure distribution, the most optimal humidity value, the electrode which is in contact with the most optimal body part, and/or the electrode that is in contact with the user and has the minimum pressure.

In an embodiment, the plurality of electrodes may be divided into a first set of exposed electrodes dedicated to being ground electrodes, and a second set of insulated electrodes dedicated to being signal electrodes. In this embodiment, step 604 may be specifically selecting a subset of electrodes (e.g., only one electrode) from the second set of insulated electrodes to be signal electrodes. A driving signal may then be multiplexed to the selected electrode, while the remaining electrodes in the first set of electrodes may be disconnected from the driving signal. In this embodiment, all electrodes in the first set of exposed electrodes may be used as ground electrodes, or a subset of the electrodes from the first set may be selected to be ground electrodes.

In an embodiment, the plurality of electrodes of the handheld interface device may all be insulated electrodes that are each switchable between being a signal electrode and a ground electrode. In this embodiment, the control unit in step 604 may be selecting a subset of electrodes in which some electrode(s) in the subset will be used as signal electrode(s), while other electrode(s) of the subset will be used as ground electrode(s). For instance, the control unit in step 604 may select from the plurality of insulated electrodes at least two electrodes that have the best contact conditions, and then connect one of the at least two insulated electrodes to the driving signal, and connect another of the at least two insulated electrodes to ground. In another embodiment, the control unit may select a subset number of electrodes (e.g., four electrodes) having the best contact conditions, and select from that subset a predetermined number (e.g., one) of the smallest electrodes to be ground electrodes, and then assign the remaining electrodes in the subset to be signal electrodes. In this embodiment, the number of electrodes selected as a signal electrode may be only one, or more than one. Further in this embodiment, electrodes which are not in the selected subset of electrodes may be left in an electrically floating state. In another embodiment, electrodes which are not in the selected subset of electrodes may be grounded.

In step 606, the control unit may apply a drive signal for generating electrostatic friction to only one or more electrodes in the selected subset of the plurality of electrodes. In other words, the control unit refrains from applying the drive signal to electrodes that are not in the selected subset, as this may save power. In an embodiment in which the control unit is selecting a subset of electrodes to be only signal electrodes, the control unit may apply the drive signal to all electrodes in the selected subset of electrodes. In an embodiment in which the control unit is selecting a subset of electrodes to be signal electrodes and ground electrodes, the control unit in step 606 may apply the drive signal to only the signal electrodes in the selected subset of electrodes, and not to the ground electrodes in the selected subset of electrodes.

Figure 7:
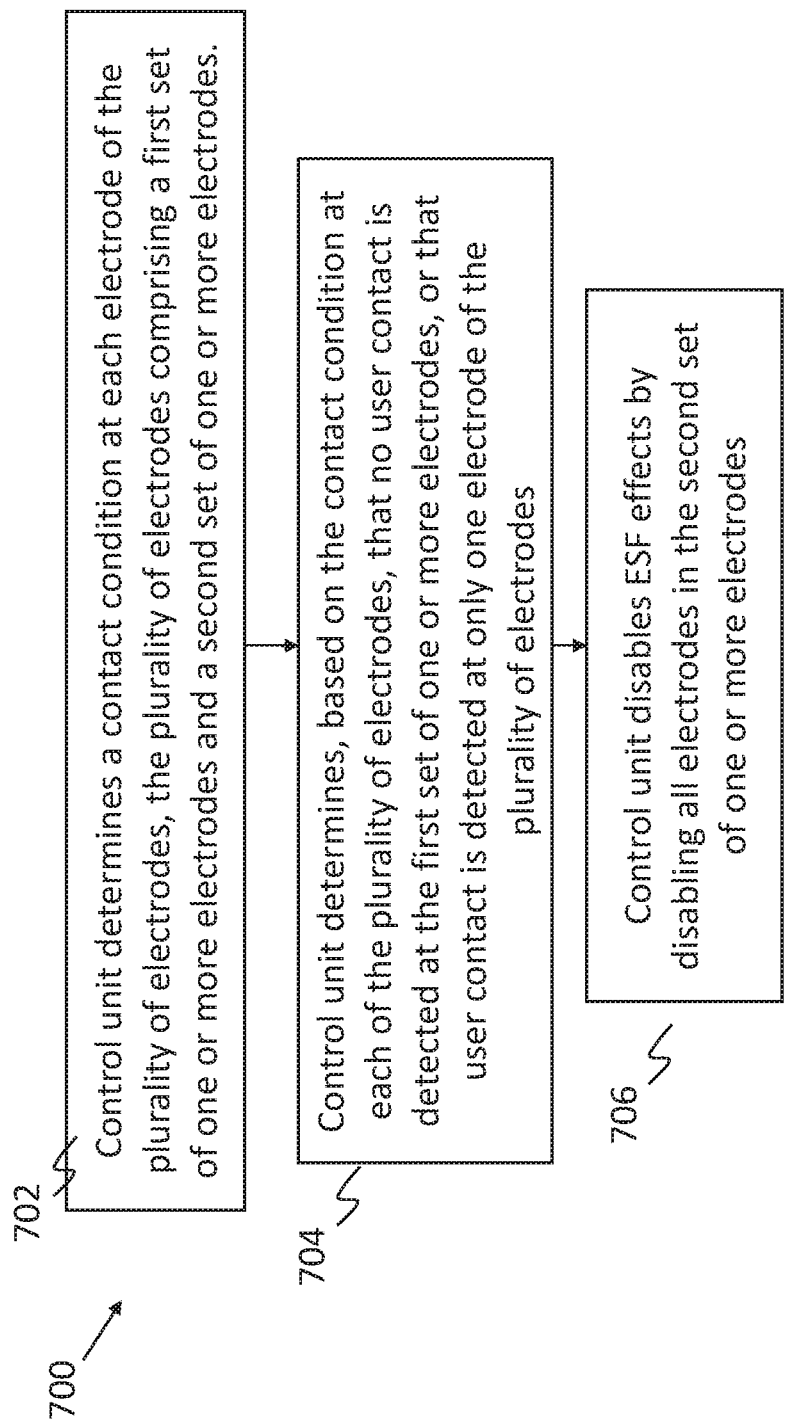
FIG. 7 provides a flow diagram of an example method for disabling electrostatic friction effects on a handheld interface device, according to an embodiment herein.

FIG. 7 provides a flow diagram which illustrates steps of a method 700 by which a handheld interface device determines whether to provide an electrostatic friction (ESF) effect to a user in accordance with another embodiment hereof. While method 600 in FIG. 6 involves selecting an electrode to which an ESF drive signal is applied, the method 700 in FIG. 7 may disable ESF effects in the device if contact conditions are poor for all electrodes that are ground electrodes or switchable to being ground electrodes. The handheld interface device (e.g., device 100) in method 700 may comprise a plurality of electrodes (e.g., more than two electrodes), with each electrode (e.g., electrode 104$i$) of the plurality of electrodes being separately disposed at a respective portion (e.g., portion 102$i$) of an outer surface of the interface device. The plurality of electrodes may comprise a first set of one or more electrodes that are each a ground electrode or an electrode switchable to being a ground electrode, and a second set of one or more electrodes that are each a signal electrode or an electrode switchable to being a signal electrode. Each of the electrodes may be covered by the electrode's respective portion of the outer surface or may form the electrode's respective portion of the outer surface.

In an embodiment, method 700 begins at step 702, in which a control unit of the handheld interface device determines a contact condition at each electrode of the plurality of electrodes. The contact condition may be determined in a manner similar to step 602.

In step 704, the control unit determines, based on the contact condition at each of the plurality of electrodes, that no user contact has been detected at the first set of one or more electrodes, or that user contact has been detected at only one electrode of the plurality of electrodes.

In some cases, ESF effects in a handheld interface device may be disabled if no user contact has been detected at the first set of one or more electrodes. This may apply to, e.g., a handheld interface device in which the first set of electrodes are dedicated to being signal electrodes, and all other electrodes are dedicated to being ground electrodes. In such a situation, the user would not be in contact with any potential signal electrode. Thus, the handheld interface device may be unable to apply a driving signal to the user. The device may then disable ESF effects by, e.g., refraining from generating a signal with the signal generating circuit 504, powering down the signal generating circuit 504, electrically disconnecting all electrodes from the signal generating circuit 504, leaving all electrodes in an electrically floating state, and/or electrically connecting all electrodes to ground.

In some situations, ESF effects may be disabled if user contact has been detected at only one electrode of the plurality of electrodes is in contact with the user. This may apply to, e.g., a handheld interface device that has only insulated electrodes which are each switchable between being a signal electrode and being a ground electrode. In some cases, the ESF effect may be too faint if a user is in contact with only one or more signal electrodes, and is not in contact with a ground electrode. If only one electrode of the plurality of electrodes is in contact with a user, this electrode may be unable to be both a signal electrode and a ground electrode simultaneously. Thus, any ESF effect in this situation may be too faint. The handheld interface device may therefore disable ESF effects by, e.g., powering down the signal generating circuit and/or electrically connecting all electrodes to the ground potential.

In step 706, in response to determining that no user contact has been detected at the first set of one or more electrodes or that user contact has been detected at only one electrode of the plurality of electrodes, the control unit as discussed above may disable ESF effects on the handheld interface device by disabling all electrodes in the second set of one or more electrodes. Thus, if it is determined that a ground electrode will not be available to accompany a signal electrode for generating an ESF effect, ESF effects may be disabled by, e.g., disabling the signal electrode. The disabling of the ESF effects may be performed even when at least one of the disabled one or more signal electrodes is in contact with the user. An electrode in the second set of one or more electrodes may be disabled by, e.g., leaving the electrode in an electrically floating state, or electrically connecting the electrode to a ground state.

Figure 8C:
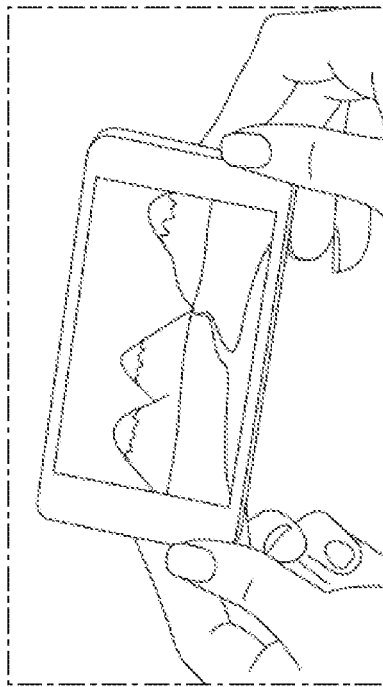
FIGS. 8A-8C provide examples of various grip postures by which a handheld interface device is held, and of different applications running on the handheld interface device, according to an embodiment herein.
Figure 8B:
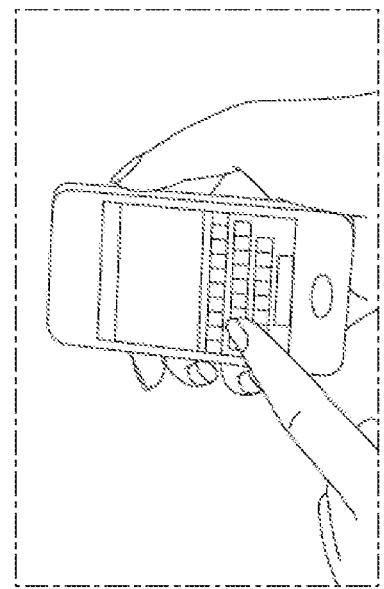
Figure 8A:
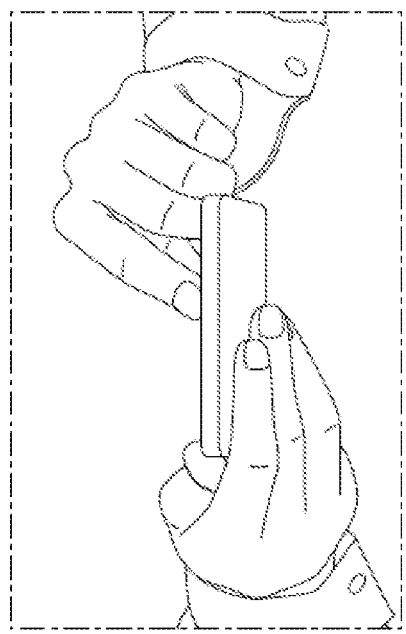

FIGS. 8A-8C illustrate example grips of a handheld interface device, such as a mobile phone. These examples show how the locations at which a user grips the mobile phone changes based on an orientation of the mobile phone and/or how the mobile phone is being used. In FIG. 8A, the mobile phone is in a landscape orientation and is being used to, e.g., present a user-interactive game. In this context, the mobile phone may be more likely to be gripped through user contact at a center of its back surface and on one of its shorter side surfaces. The mobile phone may also be likely to receive user contact on its front surface (on the touch screen) as a way of receiving user input. In FIG. 8B, the mobile phone is in a portrait orientation and is being used, e.g., to receive user input for typing a text message. In this context, the mobile phone may be more likely to be gripped through user contact on its longer side surfaces. The mobile phone may also receive user contact on its front surface (on the touch screen) as a way of receiving user input. In FIG. 8C, the mobile phone is also in a landscape orientation, like in FIG. 8A, but may be used to present a video that is not user interactive. In this context, the mobile phone may be more likely to be gripped on both of its shorter side surfaces.

As another example, when the mobile phone is used for typing with two hands, electrodes on the left and right sides of the device may be selectively activated as ground and signal electrodes. Alternatively when the device is held in the palm of one hand to watch a video, two electrodes on the back may be selectively activated for the signal and ground electrodes. Alternatively when the mobile phone is used to make a call, electrodes on the edge and back may be selectively activated for the signal and ground electrodes.

Figure 9B:
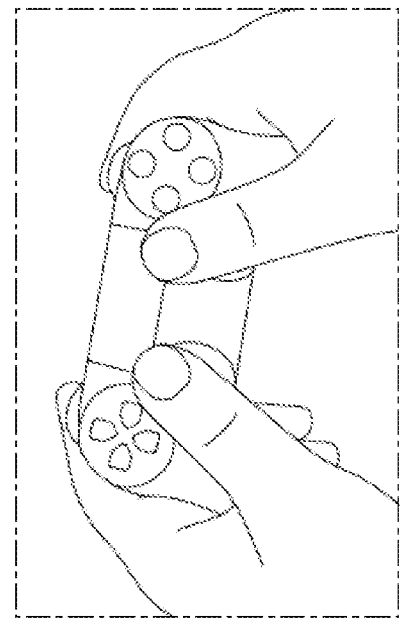
FIGS. 9A-9C provide examples of various grip postures by which a handheld interface device is held, according to an embodiment herein.
Figure 9C:
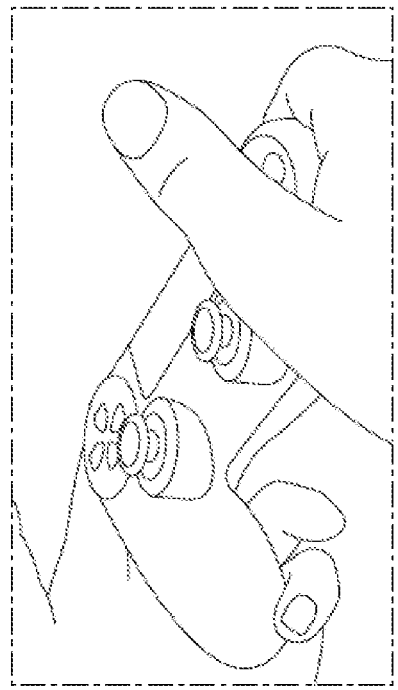
Figure 9A:
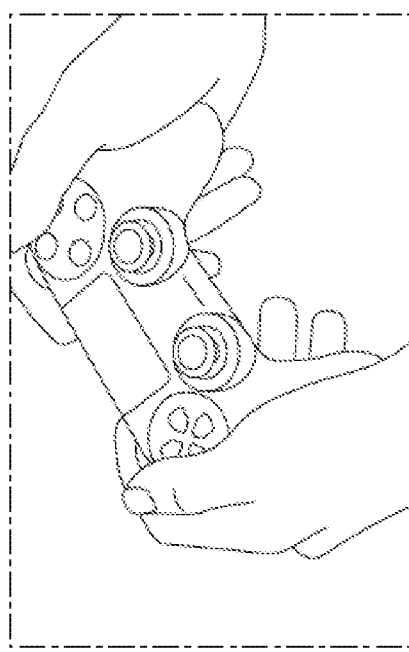

FIGS. 9A-9C illustrate example grips of a handheld interface device, such as a game controller. The figures show that various fingers on a user's hand or various portions on a user's palm may change where they contact the game controller, or whether they contact the game controller based on user preference, a game being played or a scenario in the game being played, or any other factor.

Embodiments herein may be used for a mobile phone, gaming, automotive, augmented reality (AR), virtual reality (VR), or wearables application. For example, the handheld interface device may be a controller for a VR or AR application.

Embodiments herein may be used for dynamic ESF effects or static ESF effects. For static ESF effects, the drive signal applied to the selected subset of the plurality of electrodes may have an amplitude of at least 1 kV.

While various embodiments have been described above, it should be understood that they have been presented only as illustrations and examples of the present invention, and not by way of limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment. All patents and publications discussed herein are incorporated by reference herein in their entirety.

What is claimed is:

1. A handheld interface device configured to provide an electrostatic friction (ESF) effect, the handheld interface device comprising:
   a plurality of electrodes, with each electrode of the plurality of electrodes being separately disposed at a respective portion of an outer surface of the handheld interface device, wherein each electrode of the plurality of electrodes is covered by the electrode's respective portion of the outer surface or forms the electrode's respective portion of the outer surface, wherein the plurality of electrodes comprises more than two electrodes, and wherein each electrode of the plurality of electrodes is switchable between being a signal electrode and a ground electrode;
   a control circuit configured:
      to determine a contact condition at each electrode of the plurality of electrodes, wherein the contact condition indicates whether user contact is detected at the respective portion of the outer surface that is formed by the electrode or that covers the electrode, and further indicates at least one of: i) an area of any detected user contact at the respective portion of the outer surface, ii) an amount of pressure exerted by the user contact on the respective portion of the outer surface, or iii) a pressure distribution of the user contact on the respective portion of the outer surface,
      to select from among the plurality of electrodes at least two electrodes that have the largest respective areas of user contact, the highest respective levels of pressure exerted by the user contact, or the most uniform respective distributions of pressure relative to other electrodes of the plurality of electrodes, and
      to apply a drive signal for generating electrostatic friction to a first electrode of the at least two electrodes, and
      to connect a second electrode of the at least two electrodes to ground.

2. The handheld interface device of claim 1, wherein the contact condition for one electrode of the plurality of electrodes whose respective portion of the outer surface is in contact with a user further indicates which location on a user is in contact with the respective portion of the outer surface formed by or covering the electrode.

3. The handheld interface device of claim 1, wherein the plurality of electrodes includes a plurality of insulated electrodes.

4. The handheld interface device of claim 3, wherein the at least two electrodes that are selected have different respective sizes, wherein the control circuit is configured to select a smallest electrode of the at least two electrodes as the ground electrode and to select remaining electrodes of the at least two electrodes as signal electrodes, wherein the drive signal is applied to only the electrodes selected as signal electrodes.

5. The handheld interface device of claim 4, wherein the control circuit is configured to select more than one electrode of the at least two electrodes as signal electrodes.

6. The handheld interface device of claim 1, wherein the outer surface of the handheld interface device comprises a front surface having a display, and a back surface opposite the front surface, wherein the plurality of electrodes comprises an electrode at a center of the back surface and other electrodes located closer to an edge of the back surface.

7. The handheld interface device of claim 1, wherein the handheld interface device is a controller for a virtual reality (VR) application or augmented reality (AR) application.

8. The handheld interface device of claim 1, wherein the drive signal applied to the first electrode has an amplitude of at least 1 kV.

9. A handheld interface device configured to determine whether to provide an electrostatic friction (ESF) effect, the handheld interface device comprising:
  a plurality of electrodes, with each electrode of the plurality of electrodes being separately disposed at a respective portion of an outer surface of the handheld interface device, wherein each electrode of the plurality of electrodes is covered by the electrode's respective portion of the outer surface or forms the electrode's respective portion of the outer surface, and wherein the plurality of electrodes comprises a first set one or more electrodes that are each a ground electrode or an electrode switchable to being a ground electrode, and a second set of one or more electrodes that are each a signal electrode or switchable to being a signal electrode;
  a control circuit configured:
    to determine a contact condition at each electrode of the plurality of electrodes, wherein the contact condition indicates whether user contact is detected at the respective portion of the outer surface that is formed by the electrode or that covers the electrode,
    to determine, based on the contact condition at each electrode of the plurality of electrodes, that user contact has been detected at only one electrode of the plurality of electrodes, and
    in response to determining that user contact has been detected at only one electrode of the plurality of electrodes, to disable ESF effects on the handheld interface device by disabling all electrodes of the plurality of electrodes.

10. The handheld interface device of claim 9, wherein the second set of one or more electrodes are each switchably connected to a signal source and are covered by the outer surface of the handheld interface device.

11. A method of providing an electrostatic friction (ESF) effect for a handheld interface device, which comprises a plurality of more than two electrodes that are each separately disposed at a respective portion of an outer surface of the handheld interface device and are each covered by the respective portion of the outer surface or forms the respective portion of the outer surface, wherein each electrode of the plurality of electrodes is switchable between being a signal electrode and a ground electrode, the method comprising:
  determining, by the handheld interface device, a contact condition at each electrode of the plurality of electrodes, wherein the contact condition indicates whether user contact is detected at the respective portion of the outer surface that is formed by the electrode or that covers the electrode, and further indicates at least one of: i) an area of any detected user contact at the respective portion of the outer surface, ii) an amount of pressure exerted by the user contact on the respective portion of the outer surface, or iii) a pressure distribution of the user contact on the respective portion of the outer surface;
  selecting, by the handheld interface device and from among the plurality of electrodes, at least two electrodes that have the largest respective areas of user contact, the highest respective levels of pressure exerted by the user contact, or the most uniform respective distributions of pressure relative to other electrodes of the plurality of electrodes;
  applying, by the handheld interface device, a drive signal for generating electrostatic friction to a first electrode of the at least two electrodes; and
  connecting a second electrode of the at least two electrodes to ground.

12. The method of claim 11, wherein selecting the at least two electrodes comprises selecting electrodes having the highest respective levels of pressure exerted by a detected user contact on respective portions of the outer surface of the handheld interface device, relative to other electrodes of the plurality of electrodes.

13. The method of claim 11, wherein selecting the at least two electrodes comprises selecting electrodes having the most uniform pressure distributions on the respective portions of the outer surface of the handheld interface device, relative to other electrodes of the plurality of electrodes.

14. A method of providing an electrostatic friction (ESF) effect for a handheld interface device, which comprises a plurality of electrodes that are each separately disposed at a respective portion of an outer surface of the handheld interface device and are each covered by the respective portion of the outer surface, wherein the plurality of electrodes are each an insulated electrode that is switchable between being a signal electrode and a ground electrode, the method comprising:
  determining, by the handheld interface device, a contact condition at each electrode of the plurality of electrodes, wherein the contact condition indicates whether user contact is detected at the respective portion of the outer surface that covers the electrode;
  determining, based on the contact condition at each electrode of the plurality of electrodes that user contact has been detected at only one electrode of the plurality of electrodes, and
  in response to determining that user contact has been detected at only one electrode of the plurality of electrodes, disabling ESF effects on the handheld interface device by disabling all electrodes of the plurality of electrodes.

\* \* \* \* \*